United States Patent
Wang et al.

(10) Patent No.: US 9,880,201 B2
(45) Date of Patent: Jan. 30, 2018

(54) SYSTEMS FOR PROBING SEMICONDUCTOR WAFERS

(71) Applicant: TAIWAN SEMICONDUCTOR MANUFACTURING COMPANY, LTD., Hsinchu (TW)

(72) Inventors: Mill-Jer Wang, Hsinchu (TW); Ching-Nen Peng, Hsinchu (TW); Hung-Chih Lin, Hsinchu (TW); Hao Chen, Luzhou (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/601,671

(22) Filed: Jan. 21, 2015

(65) Prior Publication Data
US 2015/0130498 A1     May 14, 2015

Related U.S. Application Data

(62) Division of application No. 13/277,761, filed on Oct. 20, 2011, now Pat. No. 8,952,711.

(51) Int. Cl.
| | |
|---|---|
| *G01R 31/00* | (2006.01) |
| *G01R 1/073* | (2006.01) |
| *G01R 35/00* | (2006.01) |
| *G01R 31/28* | (2006.01) |
| *G01R 31/26* | (2014.01) |
| *G01R 31/319* | (2006.01) |
| *G01R 31/11* | (2006.01) |

(52) U.S. Cl.
CPC ...... *G01R 1/07307* (2013.01); *G01R 31/2601* (2013.01); *G01R 31/2891* (2013.01); *G01R 35/005* (2013.01); *G01R 31/11* (2013.01); *G01R 31/3191* (2013.01)

(58) Field of Classification Search
CPC ........ G01R 31/318511; G01R 31/2851; G01R 1/06722; G01R 31/2831; G01R 1/0675; G01R 31/303; G01R 31/311
See application file for complete search history.

(56) References Cited

U.S. PATENT DOCUMENTS

| | | | |
|---|---|---|---|
| 5,561,377 A | 10/1996 | Strid et al. | |
| 6,911,814 B2 * | 6/2005 | Miller | G01R 35/00 324/750.01 |
| 2007/0085554 A1 * | 4/2007 | Huang | G01R 1/07364 324/755.01 |
| 2007/0126442 A1 * | 6/2007 | Watanabe | G01R 1/06761 324/755.07 |
| 2007/0170939 A1 * | 7/2007 | Park | G01R 31/2886 324/750.01 |
| 2008/0143366 A1 * | 6/2008 | Kurotori | G01R 1/07371 324/755.11 |
| 2009/0079452 A1 * | 3/2009 | Eldridge | G01R 31/2891 324/756.03 |

\* cited by examiner

*Primary Examiner* — Tung X Nguyen
(74) *Attorney, Agent, or Firm* — Hauptman Ham, LLP

(57) ABSTRACT

A wafer probing system includes a plurality of contacting pins connected to a test head. The system further includes a probe card electrically connectable with the test head, where the probe card includes a circuit board having a plurality of contact pads on opposite sides of the circuit board.

20 Claims, 13 Drawing Sheets

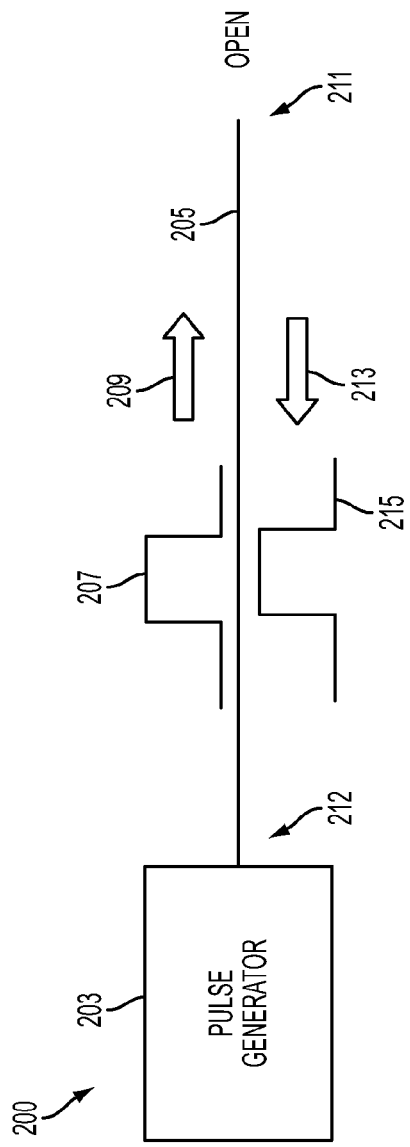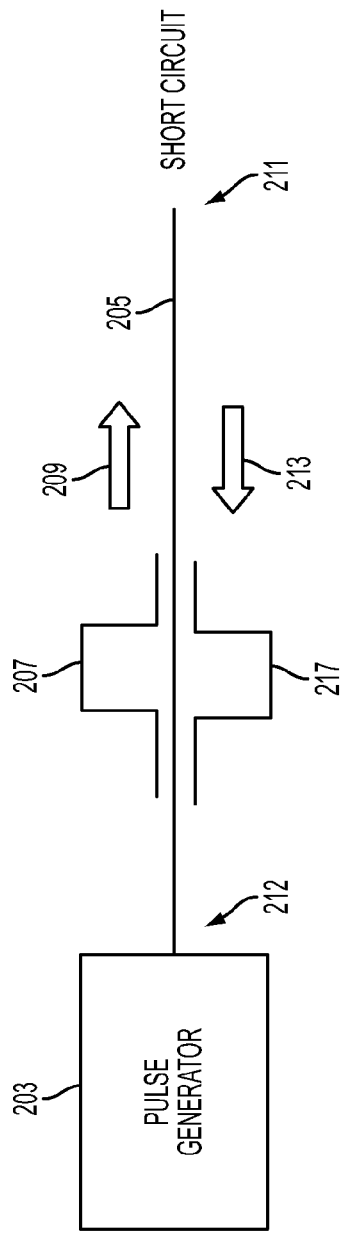

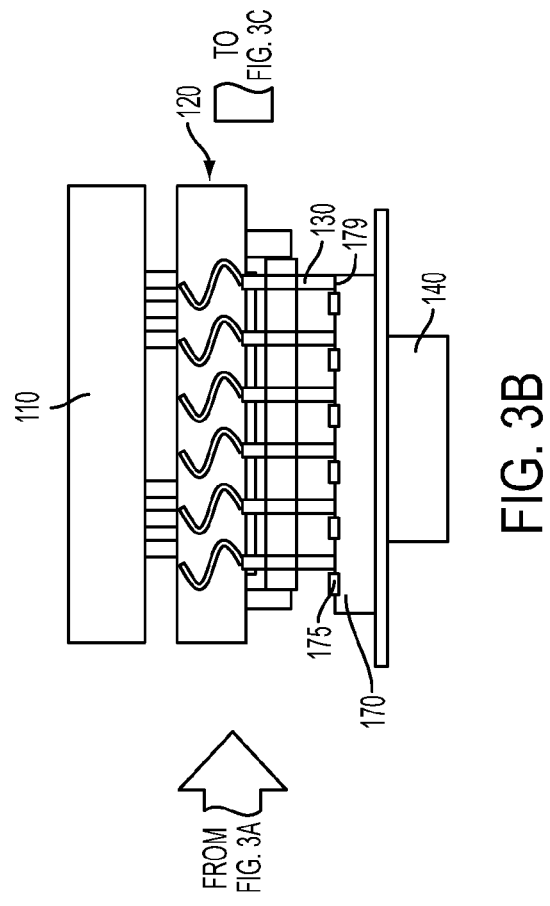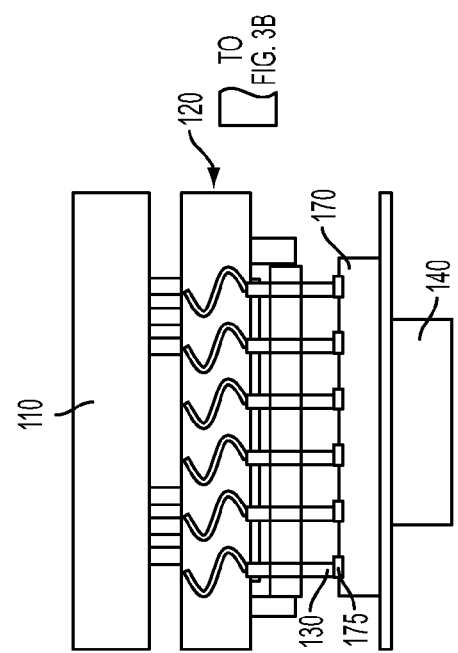

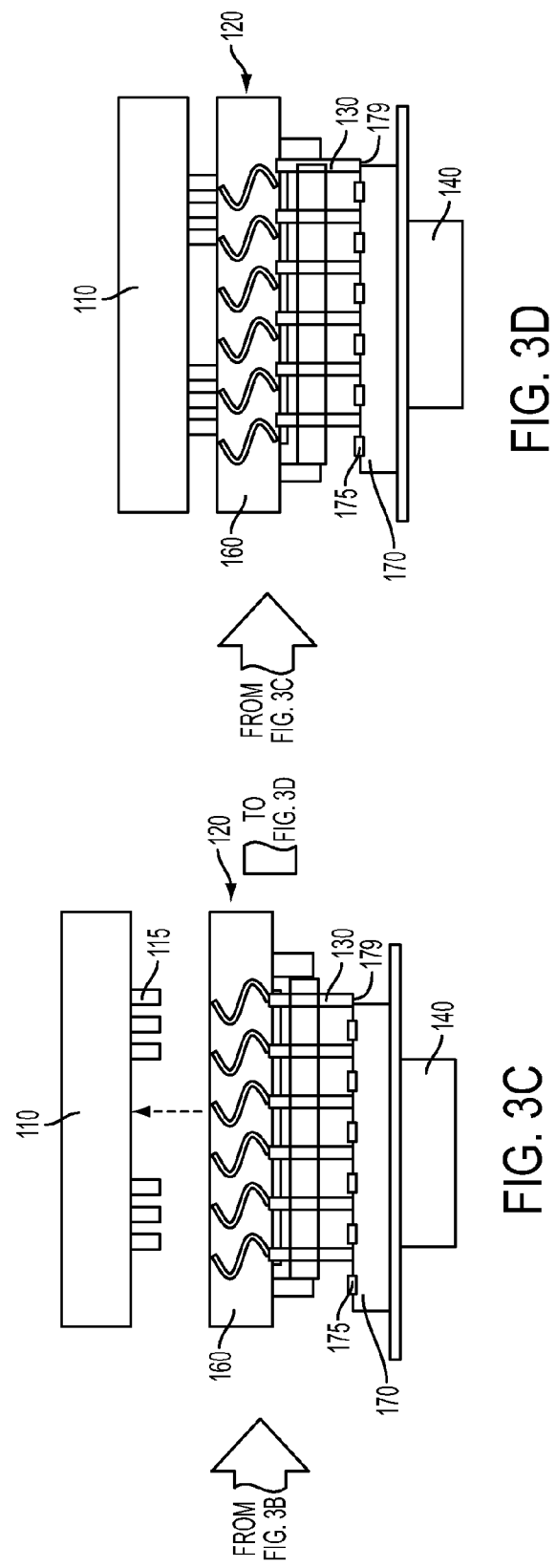

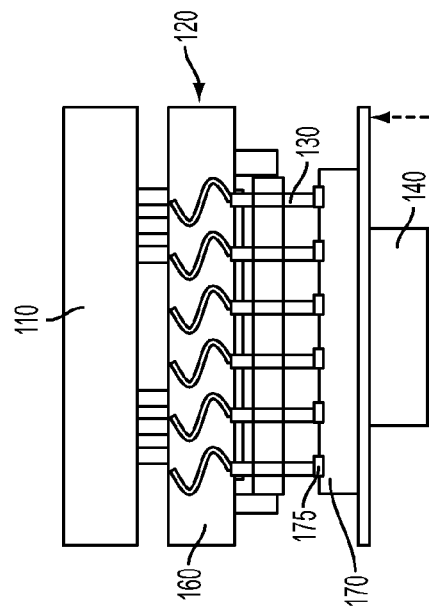
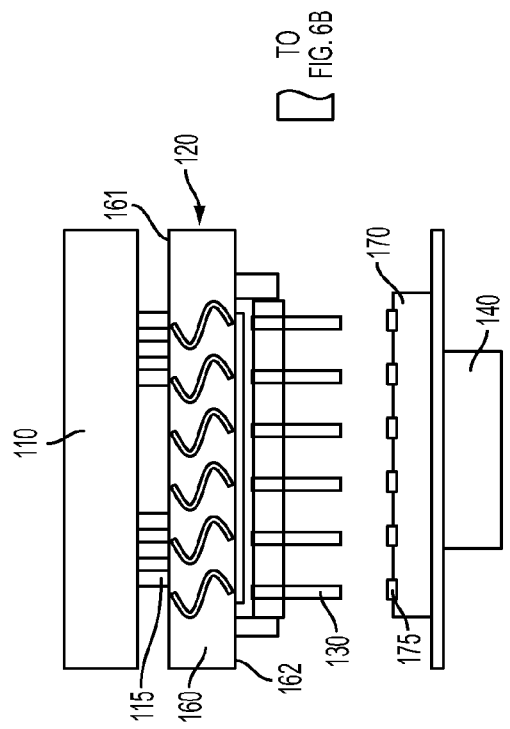

SYSTEMS FOR PROBING SEMICONDUCTOR WAFERS

PRIORITY CLAIM

The present application is a divisional of U.S. application Ser. No. 13/277,761, filed Oct. 20, 2011, now U.S. Pat. No. 8,952,711 which is incorporated herein by reference in its entirety.

TECHNICAL FIELD

The present disclosure relates to systems for probing semiconductor wafers.

BACKGROUND

Generally, semiconductor wafers are tested (or probed) before being singulated into individual chips or dies. The reason is to check for faults and to identify defective dies which will be marked to be excluded from a subsequent packaging process after singulation. Thus, packaging costs can be saved.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 2A-2B are schematic diagrams of equipment and signals for time-domain reflectometry (TDR).

FIGS. 3A-3D are schematic diagrams of a probing system at various stages during a calibration process in accordance with some embodiments.

FIGS. 6A-6B are schematic diagrams of a probing system at various stages during a continuity check in accordance with some embodiments.

DETAILED DESCRIPTION

Figure 1:
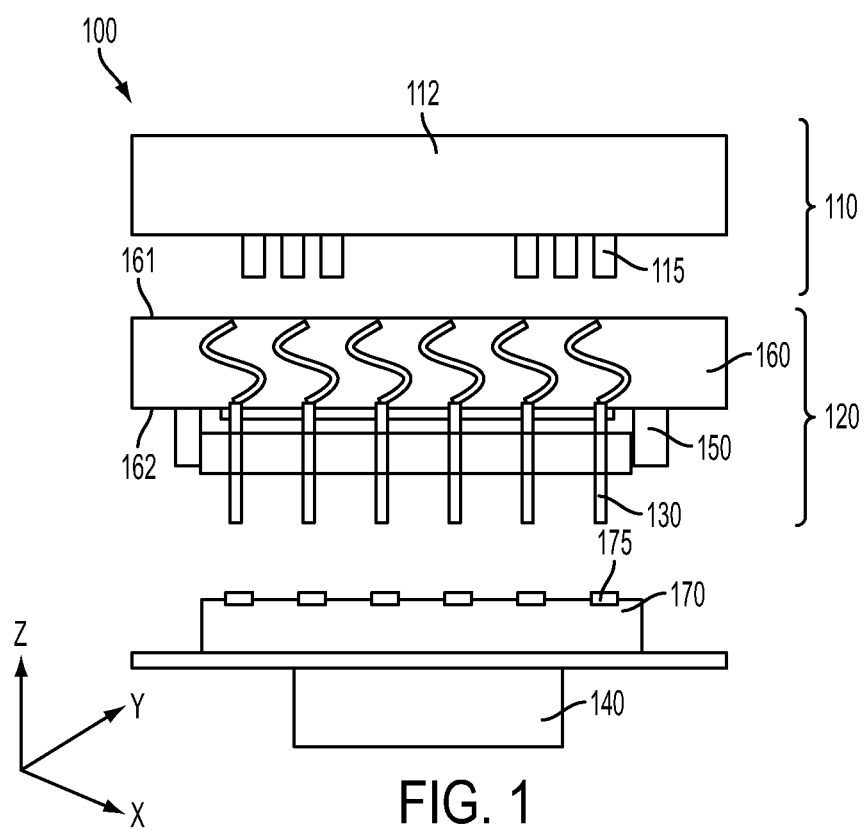
FIG. 1 is a schematic diagram of a system for probing semiconductor wafers in accordance with some embodiments.

It is to be understood that the following disclosure provides many different embodiments, or examples, for implementing different features of various embodiments. Specific examples of components and arrangements are described below to simplify the present disclosure. The inventive concept may, however, be embodied in many different forms and should not be construed as being limited to the embodiments set forth herein; rather, these embodiments are provided so that this description will be thorough and complete, and will fully convey the inventive concept to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the inventive concept.

FIG. 1 is a schematic diagram of a system 100 for probing semiconductor wafers in accordance with some embodiments.

The wafer probing system 100 includes a test head 110, a probe card 120 having a plurality of probe pins 130, and a chuck 140. The test head 110 is electrically connectable with one side of the probe card 120. The probe pins 130 are arranged at the opposite side of the probe card 120 for electrical connection to respective conductors of a wafer under test supported on the chuck 140.

The test head 110 is arranged to generate or route test signals for the probe pins 130 via the probe card 120. More particularly, the test head 110 is arranged to generate test signals itself, and/or to receive test signals from a testing circuit and then transmit the received test signals to the probe pins 130 via the probe card 120. The test head 110 includes one or more circuitry which are configured for the above-described purposes and are arranged, in some embodiments, on a printed circuit board (also known as a channel board) 112.

The test head 110 is electrically connectable to (docking) and disconnectable (undocking) from the probe card 120. For this purpose, in some embodiments, the test head 110 includes contacting pins 115 for electrical connection to and disconnection from the probe card 120. The test head 110 and the probe card 120 are moveable relative to each other, in some embodiments, to make or break the contacts between the contacting pins 115 and respective contact pads on the probe card 120. In some embodiments, the contacting pins 115 are spring-loaded pins, such as those generally known in the art as pogo pins, to ensure proper electrical contract between the test head 110 and probe card 120. In some embodiments, a locking mechanism is provided to lock the test head 110 to the probe card 120 to maintain electrical connection between the test head 110 and probe card 120 and to safeguard against undesirable or unintended undocking of the test head 110 from the probe card 120.

The probe card 120 includes, in addition to the probe pins 130, a probe card circuit board 160, e.g., a printed circuit board (PCB), and a holder 150.

The probe card circuit board 160 defines an interface for routing test signals from the test head 110 to the probe pins 130. The probe card circuit board 160 includes the contact pads, on a surface 161 of the probe card circuit board 160 facing the test head 110, to be connected to (and disconnected from) the contacting pins 115 of the test head 110. The contact pads of the probe card circuit board 160 are electrically connected, via internal conductors in the probe card circuit board 160, to further contact pads on an opposite surface 162 of the probe card circuit board 160 for connection with the probe pins 130. In some embodiments, a substrate is interposed between the probe card circuit board 160 and the probe pins 130 to further facilitate signal routing from the probe card circuit board 160 to the probe pins 130.

The holder 150 is arranged for holding the probe pins 130 in alignment with the corresponding contact pads on the surface 162 of the probe card circuit board 160. In some embodiments, the holder 150 holds, while permitting displacement of, the probe pins 130, thereby enabling the probe pins 130 to move toward and away from the probe card circuit board 160, and to be connected to and disconnected from the probe card circuit board 160.

The probe pins 130 are arranged in an array and are of any configuration suitable for probing semiconductor wafers or dies. In some embodiments, the probe pins 130 are resilient pins, such as those generally known in the art as pogo pins, to ensure proper electrical contract between the probe pins 130 and a wafer under test 170. A exemplary construction of a pogo pin includes two hollow tubes telescopically received on in another, and a spring disposed inside and between the tubes. An interlocking element is provided to prevent the tubes from disengaging from each other under action of the spring. When the pogo pin is pressed between two circuits, e.g., between the probe card circuit board 160 and the wafer under test 170, the spring biases the tubes against the circuits to provide an electrical connection between the circuits.

In some embodiments, the probe card 120 is a tip-replaceable probe card which permits replacement of the probe pins 130 when worn. Such a configuration is advantageous in relatively low replacement and maintenance costs.

The chuck 140 is arranged for supporting thereon a wafer, for example, the wafer under test 170 or a dummy wafer, and for permitting relative movements between the supported wafer and the probe pins 130. Specifically, the chuck 140 is configured to move in the X and Y directions (as schematically shown in FIG. 1) to align the supported wafer with the probe pins 130, and also in the Z direction to move the supported wafer towards and away from the probe pins 130 for causing intended electrical contacts between the probe pins 130 and the supported wafer. In some embodiments where the probe pins 130 are moveably supported by the holder 150, the probe pins 130 are moved toward and away from the probe card circuit board 160 and connected to and disconnected from the probe card circuit board 160, in accordance with movement of the chuck 140. Instead of the chuck 140, any other mechanism for supporting the wafer while permitting the described relative movement is implementable in further embodiments.

The wafer under test 170 includes on a surface thereof a plurality of conductors 175 The conductors 175 include, but are not limited to, conductive traces (patterns), bonding pads, bumps, test pads, etc. Conductive traces are for routing electrical signals, power or ground voltages among components and/or integrated circuits included in/on the wafer under test 170. Bonding pads and bumps are for electrical and/or mechanical connections to external devices. Test pads are arranged specifically for testing purposes. Any conductor on the surface of the wafer under test 170 can be considered as a conductive pad to be brought into contact with one of the probe pins 130 for receiving test signals to probe the wafer under test 170. However, not all conductors 175 on the surface of the wafer under test 170 are used for probing the wafer under test 170 in every test. In a certain test, those conductors 175 which are to be used for probing the wafer under test 170 are referred to as conductive pads to be tested.

The wafer under test 170 further includes electronic components formed therein and/or thereon. Examples of such electronic components include, but are not limited to, transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; and other suitable elements. The electronic components are interconnected to form integrated circuit devices, such as a logic device, memory device (e.g., SRAM), RF device, input/output (I/O) device, system-on-chip (SoC) device, combinations thereof, and other suitable types of devices.

In some embodiments, the wafer under test 170 includes three-dimensional integrated circuits (3D ICs). A 3D IC includes two or more chips which are in different wafers and which are stacked and bonded together. Such chips that make up the 3D IC are also referred to as interposers. An interposer includes one or more active components and/or passive components. If an interposer includes no active component, it is a passive interposer. Conductive vias, e.g., through-silicon vias (TSVs), are formed to define interconnect structures that interconnect the chips in the 3D IC together. The interconnect structures are also connected via TSVs to conductors, e.g., pads, on an outer surface of the 3D IC. The pads are used to connect the 3D IC to external devices and/or for testing the 3D IC before singulation and packaging. It is also possible to test interposers before stacking and bonding the interposers to obtain a 3D IC.

During a semiconductor wafer testing process, the wafer under test 170 is supported on the chuck 140. A controller moves the chuck 140, in the X and Y directions, relative to the probe pins 130 to align the conductive pads to be tested of the wafer under test 170 with the probe pins 130. The controller then causes the chuck 140 to move, in the Z direction, toward the probe pins 130 with an overdrive travel beyond the point where the probe pins 130 first contact the respective conductive pads to be tested of the wafer under test 170, thereby ensuring reliable mechanical and electrical contact between the probe pins 130 and the conductive pads to be tested. Test signals are transmitted from the test head 110, via the probe card circuit board 160, to the probe pins 130 and then to the conductive pads to be tested for probing the wafer under test 170. In some embodiments, automated test equipment (ATE) is used to generate test signals to be sent to the system 100 via the test head 110.

Before probing (testing) the wafer under test 170 as described above, the system 100 is calibrated to ensure test accuracy. One way to calibrate the system 100 is to perform two sets of measurements before contacting the wafer under test 170 with the probe pins 130. One set of measurements is performed before docking the test head 110 onto the probe card 120, i.e., before making contact between the contacting pins 115 and the probe card circuit board 160. The other set of measurements is performed after docking the test head 110 onto the probe card 120, i.e., before making contacts between the contacting pins 115 and the probe card circuit board 160. Based on a difference between the results of the two sets of measurements (also referred to herein as fixture delay) for each probe pin 130, the system 100 is calibrated. In some embodiments, other factors also used for calibrating the system 100 include an adequate wafer under test and a valid system calibration, the latter being specified by the manufacturer of the testing equipment up to the endpoint (e.g., contacting pins 115) of the test head 110.

However, in certain situations, such a technique does not accurately take into account several factors, such as contact impedance and/or tip length. The former reflects the impedance between the probe pins 130 and the probe card circuit board 160. The latter reflects the electrical path length of the probe pins 130 (in term of signal propagation). Without such factors, the overall signal path from the test head 110 to the probe pins 130 is not accurately reflected in the calibration result of the system 100 and may, in turn, affect the testing performance.

In some embodiments, time-domain reflectometry (TDR) is used to calibrate a wafer probing system, such as the system 100.

FIGS. 2A-2B are schematic diagrams of equipment and signals for TDR.

As shown in FIGS. 2A-2B, an exemplary TDR circuit 200 includes a pulse generator 203 for generating and applying a series of original pulses 207 (only one pulse 207 is illustrated in FIGS. 2A-2B for simplicity) at a starting point 212 of a signal path 205 (e.g., a conductor in a semiconductor device) under test. The original pulse 207 travels (propagates) along the signal path 205 in a propagation direction 209 toward an end 211 (or a discontinuity) of the signal path 205. At the end 211, the original pulse "reflects" and returns in a return direction 213 in the form of a reflected pulse 215 (FIG. 2A) or 217 (FIG. 2B). Depending on the impedance along the signal path 205, the reflected pulse will have a different shape, polarity, amplitude, etc. For example, if the end 211 is an open end (high impedance) as in FIG. 2A, the reflected pulse 215 has the same polarity as the original pulse 207. However, if the end 211 is shorted (low impedance) as in FIG. 2B, the reflected pulse 217 has the opposite polarity to the original pulse 207. A signal receiver, e.g., an oscilloscope, is positioned at the starting point 212 of the signal path 205 to measure the resulting signal combining the original pulse and the reflected pulse. Based on the resulting signal, several characteristics of the signal path 205, such as impedance distribution and propagation delay, are determined.

When the system 100 (FIG. 1) is configured to perform TDR measurements, TDR equipment such as the pulse generator 203 and/or the signal receiver (e.g., the oscilloscope) is incorporated into the test head 110 in some embodiments. In further embodiments, an external test circuitry incorporates TDR equipment, supplies TDR measurement test signals (original pulses) to the test head 110 and receives return signals (reflected pulses) from the test head 110 for processing, e.g., propagation delay determination. Other arrangements are within the scope of this disclosure.

FIGS. 3A-3D are schematic diagrams of a wafer probing system, such as the system 100 (FIG. 1), at various stages during a calibration process in accordance with some embodiments.

At the stage in FIG. 3A, the wafer under test 170 is loaded onto the chuck 140 and the conductors 175 (also referred to herein after as conductive pads to be tested) of the wafer under test 170 are aligned with the respective probe pins 130. The chuck 140 is next driven toward the probe pins 130 to cause contact between the conductors 175 and the respective probe pins 130. As described above, the chuck 140 is driven toward the probe pins 130 with an overdrive amount $OD_A$ to ensure contact between the conductors 175 and the respective probe pins 130. The overdrive amount $OD_A$ is recorded when all conductors 175 (conductive pads to be tested) are determined to be in contact with the respective probe pins 130.

At the next stage in FIG. 3B, the chuck 140 is shifted sideways, e.g., in the X-Y plane (see FIG. 1) to misalign the conductors 175 of the wafer under test 170 from the respective probe pins 130. In some embodiments, the shifting of the chuck 140 occurs after moving the chuck 140 away from the probe pins 130 to avoid excessive scrubbing of the conductors 175 by the respective probe pins 130. After the shifting, the probe pins 130 corresponding to the conductors 175 are now aligned with areas 179 of the wafer under test 170 outside the conductors 175. Such areas 179 have higher impedance than the conductors 175 and are referred to as high impedance areas 179. The system 100 will be re-probed on the high impedance areas 179 outside the conductors 175.

Because the high impedance areas 179 are farther from the probe pins 130 than the conductors 175 by a distance corresponding to the height of the conductors 175, the previously recorded overdrive amount $OD_A$ might not be sufficient to ensure contact between the high impedance areas 179 and the respective probe pins 130. Therefore, the overdrive amount $OD_A$ is adjusted with a first tolerance overdrive amount $OD_T$. In other words, an adjusted overdrive amount is obtained by adding the first tolerance overdrive amount $OD_T$ to the overdrive amount $OD_A$. The first tolerance overdrive amount $OD_T$ is selected to cover the height (thickness) of the conductors 175. For example, a first tolerance overdrive amount $OD_T$ of about 80-130 μm is selected in some embodiments.

The chuck 140 is next driven toward the probe pins 130 with the adjusted overdrive amount, to cause contact between the high impedance areas 179 and the respective probe pins 130. The system 100 is now ready for re-probing on the high impedance areas 179.

At the next step in FIG. 3C, the test head 110 is undocked from the probe card 120. With the test head 110 disconnected from the probe card 120, a first set of measurements is performed. Each measurement in the first set of measurements is performed on one of the probe pins 130 to measure a first propagation delay $T_A$ (also referred to herein as a TDR time value) of each probe pin 130. In other words, the first set of measurements is performed while the probe pins 130 are in contact with the high impedance areas 179 and with the test head 110 disconnected from the probe card 120.

At the stage in FIG. 3D, the test head 110 is docked onto the probe card 120 to be electrically connected to the probe card 120. With the test head 110 connected to the probe card 120, a second set of measurements is performed. Each measurement in the second set of measurements is performed on one of the probe pins 130 to measure a second propagation delay $T_B$ of each probe pin 130. In other words, the second set of measurements is performed while the probe pins 130 are in contact with the high impedance areas 179 and with the test head 110 connected to the probe card 120.

The first propagation delay $T_A$ reflects the electrical path length of the test head 110 (including the contacting pins 115). The second propagation delay $T_B$ reflects the electrical path length of the overall path which includes not only the test head 110 (including the contacting pins 115) but also the probe card 120 (including the probe card circuit board 160 and probe pins 130). Thus, a difference ($T_B-T_A$) between the measurement results, i.e., the first propagation delay $T_A$ and the second propagation delay $T_B$, is a TDR time value that reflects the electrical path length of the probe card 120 (including the probe card circuit board 160 and the respective probe pin 130). Because the first and second sets of measurements are performed while the probe pins 130 are in contact with the high impedance areas 179, the difference ($T_B-T_A$) (also referred to herein as fixture delay) for each probe pin 130 accurately covers factors such as contact impedance and tip length which are not accurately taken into account in the previously described calibration method where the two sets of measurements are performed without the probe pins 130 in contact with high impedance areas. As a result, the system 100 calibrated with the determined fixture delays ($T_B-T_A$), each for one probe pin 130, is more accurate than if calibrated in the previously described calibration method.

In other words, the calibration process compensates for at least one of (i) contact impedances between the probe pins 130 and the probe card circuit board 160 of the probe card 120, or (ii) or tip lengths of the probe pins 130.

In some embodiments, the stages in FIGS. 3C and 3D switch place, i.e., the second set of measurements is performed with the test head 110 connected to the probe card 120 before the first set of measurements is performed with the test head 110 disconnected from the probe card 120.

Figure 4B:
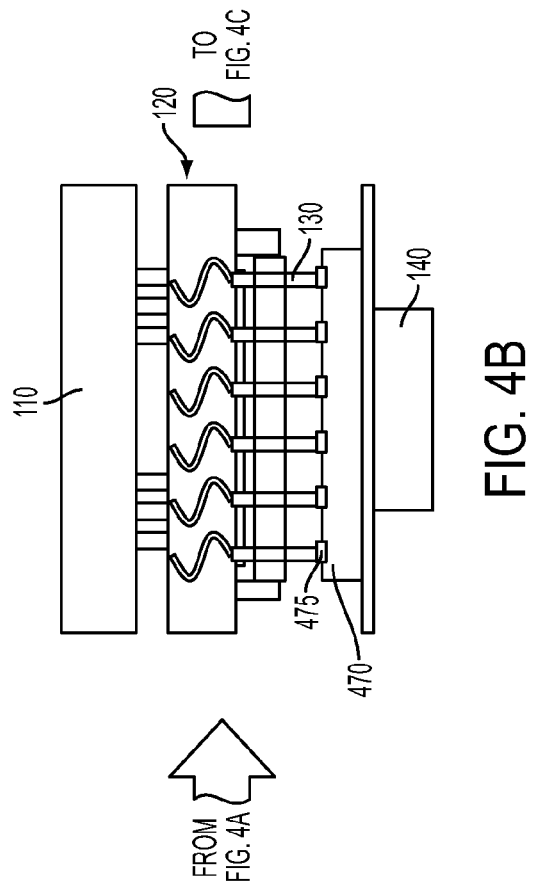
FIGS. 4A-4D are schematic diagrams of a probing system at various stages during a calibration process in accordance with some embodiments.
Figure 4A:
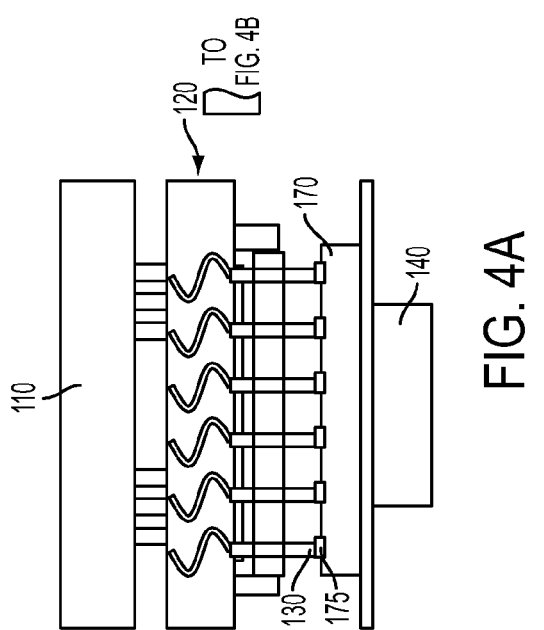

FIGS. 4A-4B are schematic diagrams of a probing system, such as the system 100, at various stages during a calibration process in accordance with some embodiments.

The stage in FIG. 4A is similar to that in FIG. 3A. Specifically, a wafer under test 170 is loaded onto the chuck 140 and the conductors 175 of the wafer under test 170 are aligned with the respective probe pins 130. The chuck 140 is next driven toward the probe pins 130 to cause contacts between the conductors 175 and the respective probe pins 130. As described above, the chuck 140 is driven with an overdrive amount $OD_A$ to ensure contact between the conductors 175 and the respective probe pins 130. The overdrive amount $OD_A$ is recorded when all conductors 175 (conductive pads to be tested) are determined to be in contact with the respective probe pins 130.

At the next stage in FIG. 4B, the chuck 140 is not shifted, unlike the stage in FIG. 3B. Instead, the wafer under test 170 is unloaded from the chuck 140 and a probe card wafer or dummy wafer 470 is loaded onto the chuck 140. The dummy wafer 470 includes a patterned metal layer 475 on its surface facing the probe pins 130. The patterned metal layer 475 corresponds to the conductors 175 (conductive pads to be tested) of the wafer under test 170. The patterned metal layer 475 define areas having higher impedance than the conductors 175 of the wafer under test 170. The system 100 will be re-probed on the high impedance, patterned metal layer 475.

The dummy wafer 470, in some embodiments, is prepared from a blank wafer with no ICs formed within. The patterned metal layer 475 is a top metal patterned using the same mask that is used to form the conductors 175 of the wafer under test 170.

Because the dummy wafer 470 with the patterned metal layer 475 might have a height different from that of the wafer under test 170 with the conductors 175, the previously recorded overdrive amount $OD_A$ might not be sufficient to ensure contact between the high impedance, patterned metal layer 475 and the respective probe pins 130. Therefore, the overdrive amount $OD_A$ is adjusted with a second tolerance overdrive amount $OD_T$. In other words, an adjusted overdrive amount is obtained by adding the second tolerance overdrive amount $OD_T$ to the overdrive amount $OD_A$. The second tolerance overdrive amount $OD_T$ is selected to cover the thickness deviation between the dummy wafer 470 and wafer under test 170. For example, a second tolerance overdrive amount $OD_T$ of about 15-30 µm is selected in some embodiments.

The chuck 140 is next driven toward the probe pins 130 with the adjusted overdrive amount, to cause contact between the high impedance, patterned metal layer 475 and the respective probe pins 130. The system 100 is now ready for re-probing on the high impedance, patterned metal layer 475.

Figure 4D:
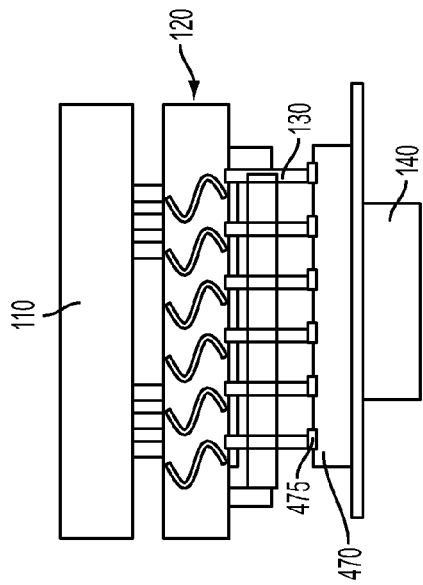
Figure 4C:
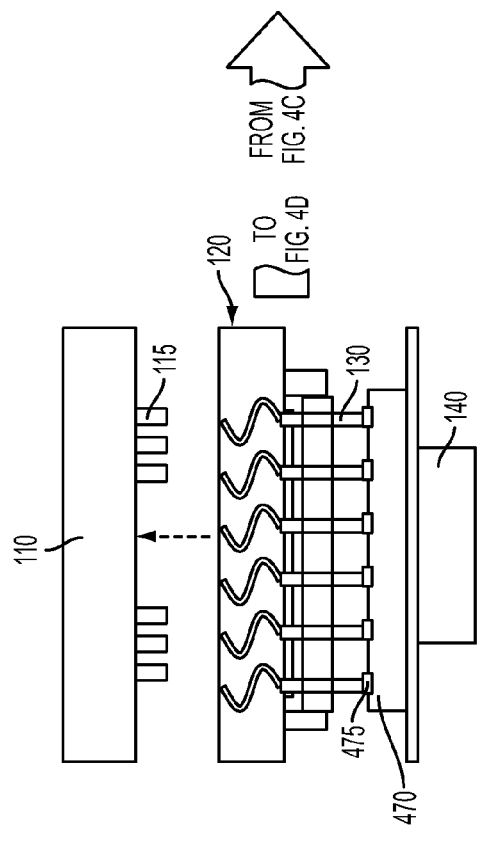

The stage in FIG. 4C is similar to that in FIG. 3C and the stage in FIG. 4D is similar to that in FIG. 3D. In other words, the first set of measurements is performed while the probe pins 130 are in contact with the high impedance areas 179 and with the test head 110 disconnected from the probe card 120, to obtain a first propagation delay $T_A$ for each probe pin 130. Further, a second set of measurements is performed while the probe pins 130 are in contact with the high impedance, patterned metal layer 475 and with the test head 110 connected to the probe card 120, to obtain a second propagation delay $T_B$ for each probe pin 130. A difference ($T_B-T_A$) between the measurement results is obtained for each probe pin 130 and is used for calibrating the system 100 with effects similar to those described with respect to FIGS. 3A-3D.

In some embodiments, the stages in FIGS. 4C and 4D switch place, i.e., the second set of measurements is performed with the test head 110 connected to the probe card 120 before the first set of measurements is performed with the test head 110 disconnected from the probe card 120.

Figure 5:
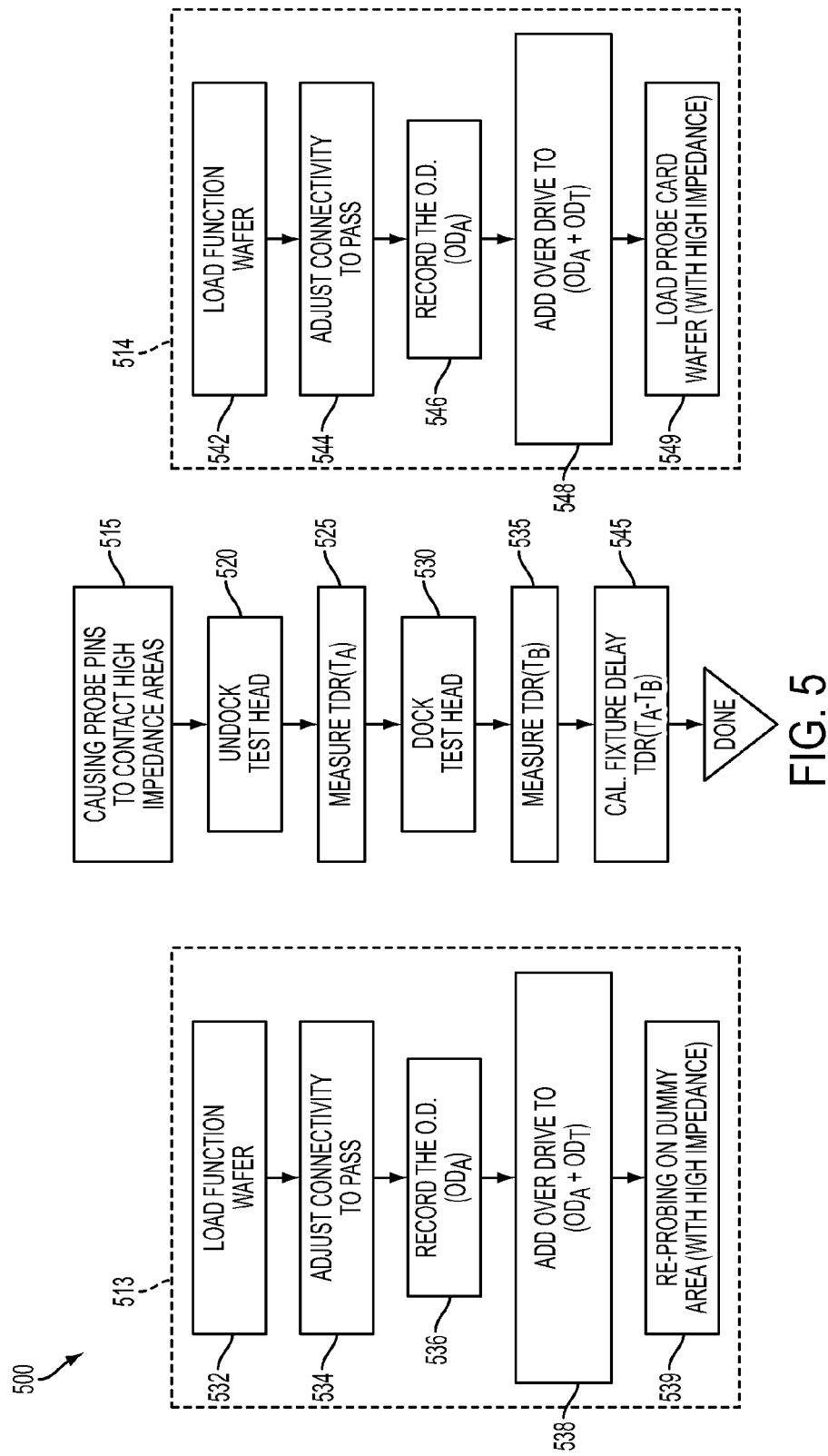
FIG. 5 is a flow chart of a calibration process in accordance with some embodiments.

FIG. 5 is a flow chart of a calibration process 500 in accordance with some embodiments. The calibration process is used for calibrating a wafer probing system (such as the system 100). The wafer probing system includes a test head (such as the test head 110), and a probe card (such as the probe card 120). The probe card has a plurality of probe pins (such as the probe pins 130), and a circuit board (such as the probe card circuit board 160) for supplying test signals from the test head to the probe pins. The wafer probing system further includes a support for supporting a wafer under test (such as the wafer under test 170) having conductive pads (such as the conductors 175) to be tested each corresponding to one of the probe pins. In some embodiments, the wafer support includes a chuck (such as the chuck 140), but other wafer supporting mechanisms are not excluded.

In the process, at step 515, the probe pins are caused to contact areas of the wafer under test or a dummy wafer. The areas have higher impedances than the respective conductive pads to be tested of the wafer under test. In some embodiments, such high impedance areas include areas (such as the high impedance areas 179) of the wafer under test outside the conductive pads to be tested, as described with respect to FIGS. 3B-3D. In further embodiments, such high impedance areas include high impedance, patterned metal layer (such as the patterned metal layer 475) of the dummy wafer, as described with respect to FIGS. 4B-4D.

At step 525, while the probe pins are in contact with the high impedance areas, a first set of measurements is performed with the test head disconnected from the probe card. In some embodiments, the first set of measurements is performed as described with respect to FIG. 3C. In further embodiments, the first set of measurements is performed as described with respect to FIG. 4C.

At step 535, while the probe pins are in contact with the high impedance areas, a second set of measurements is performed with the test head connected to the probe card. In some embodiments, the second set of measurements is performed as described with respect to FIG. 3D. In further embodiments, the second set of measurements is performed as described with respect to FIG. 4D.

At step 545, the wafer probing system is calibrated based on results of the first and second sets of measurements. In some embodiments, the result of each measurement in the first set of measurements is a first TDR time value $T_A$, and the result of each measurement in the second set of measurements is a second TDR time value $T_B$. A fixture delay of each probe pin 130 is determined as ($T_B-T_A$) and used for calibrating the wafer probing system, as described with respect to FIGS. 3C-3D and 4C-4D.

In some embodiments, steps 525 and 535 switch place. In some embodiments, the process further includes step 520 in which the test head is undocked from the probe card to prepare the wafer probing system for the first set of measurements, as described with respect to FIGS. 3C and 4C. In some embodiments, the process further includes step 530 in which the test head is docked onto the probe card to prepare the wafer probing system for the second set of measurements, as described with respect to FIGS. 3D and 4D.

In some embodiments, step 515 is implemented as a sub-process 513 described below.

At step 532 at the beginning of sub-process 513, the wafer under test is loaded onto the support.

At step 534, the wafer under test and the probe pins are aligned and moved toward each other to bring the conductive pads to be tested of the wafer under test in contact with the respective probe pins. In some embodiments, a process as described herein with respect to FIGS. 6A-6B are used to determine whether the conductive pads to be tested of the wafer under test have been in contact with the respective probe pins.

At step 536, an overdrive amount of the relative movement between the wafer under test and the probe pins is recorded when it is determined that the conductive pads to be tested of the wafer under test have been in contact with the respective probe pins. In some embodiments, steps 532, 534, 536 are performed as described with respect to FIG. 3A.

At step 538, the determined overdrive amount is adjusted to obtain an adjusted overdrive amount.

At step 539, the wafer probing system is prepared for re-probing on high impedance areas of the wafer under test. In some embodiments, step 539 includes misaligning the conductive pads to be tested of the wafer from the respective probe pins, and moving the wafer and the probe pins toward each other in accordance with the adjusted overdrive amount. As a result, the probe pins contact the areas of the wafer under test that are outside the conductive pads to be tested and have higher impedances than the conductive pads to be tested. In some embodiments, steps 538, 539 are performed as described with respect to FIG. 3B.

In some embodiments, step 515 is implemented as a sub-process 514 described below.

At step 542 at the beginning of sub-process 514, the wafer under test is loaded onto the support.

At step 544, the wafer under test and the probe pins are aligned and moved toward each other to bring the conductive pads to be tested of the wafer under test in contact with the respective probe pins. In some embodiments, a process as described herein with respect to FIGS. 6A-6B are used to determine whether the conductive pads to be tested of the wafer under test have been in contact with the respective probe pins.

At step 546, an overdrive amount of the relative movement between the wafer under test and the probe pins is recorded when it is determined that the conductive pads to be tested of the wafer under test have been in contact with the respective probe pins. In some embodiments, steps 542, 544, 546 are performed as described with respect to FIG. 4A.

At step 548, the determined overdrive amount is adjusted to obtain an adjusted overdrive amount.

At step 549, the wafer probing system is prepared for re-probing on high impedance areas of the dummy wafer. In some embodiments, step 549 includes replacing the wafer under test with the dummy wafer and moving the dummy wafer and the probe pins toward each other in accordance with the adjusted overdrive amount. As a result the probe pins contact the areas of the dummy wafer that have higher impedances than the conductive pads to be tested of the wafer under test. In some embodiments, steps 548, 549 are performed as described with respect to FIG. 4B.

After the wafer probing system has been calibrated, testing (probing) of the wafer under test begins.

Generally, a probing process begins with a continuity check to ensure contact between conductive pads to be tested of the wafer under test and respective probe pins of the wafer probing system. After a successful continuity check, further tests can be performed. Without a successful continuity check, the subsequent tests are inaccurate or even meaningless.

For probing continuity for system on chip (SOC) devices, protection diodes or pull-up/pull-down circuits are provided. For 3D ICs, such an arrangement with protection diodes or pull-up/pull-down circuits is not suitable. Especially for 3D IC passive interposers, continuity probing is blind, because, without an active device, it is difficult to determine whether the probe pin has contacted the respective conductive pad to be tested or not, or whether the contact is proper or the probe pin has been overdriven too deeply into the conductive pads to be tested.

FIGS. 6A-6B are schematic diagrams of a wafer probing system, such as the system 100, at various stages during a continuity check in accordance with some embodiments.

At the stage in FIG. 6A, the test head 110 is docked onto the probe card 120, i.e., the contacting pins 115 are in contact with respective contact pads on the surface 161 of the probe card circuit board 160 that faces the test head 110. However, further contact pads on the opposite surface 162 of the probe card circuit board 160 that faces the probe pins 130 are not in electrical connection with the respective probe pins 130. With the probe pins 130 being disconnected from the probe card circuit board 160, a first set of measurements is performed. Each measurement in the first set of measurements is performed on one of the probe pins 130 to measure a first propagation delay $T_C$ of each probe pin 130.

At the stage in FIG. 6B, the further contact pads on the opposite surface 162 of the probe card circuit board 160 that faces the probe pins 130 are brought into electrical connection with the respective probe pins 130. The wafer under test 170 is loaded onto the chuck 140 and the conductors 175 (conductive pads to be tested) of the wafer under test 170 are aligned with the respective probe pins 130. The chuck 140 is driven toward the probe pins 130 to cause contacts between the conductors 175 and the respective probe pins 130. As described above, the chuck 140 is driven with an overdrive amount to ensure contact between the conductors 175 and the respective probe pins 130. With the probe pins 130 electrically connected to both the probe card circuit board 160 and to the respective probe pins 130, a second set of measurements is performed. Each measurement in the second set of measurements is performed on one of the probe pins 130 to measure a second propagation delay $T_B$ of each probe pin 130.

In some embodiments, the loading of the wafer under test 170 onto the chuck 140 and/or the alignment of the conductive pads to be tested of the wafer under test 170 and the respective probe pins 130 is/are performed at the stage in FIG. 6A, i.e., with the probe pins 130 disconnected from the probe card circuit board 160.

A difference $T_D=(T_B-T_C)$ between the measurement results, i.e., the first propagation delay $T_C$ and the second propagation delay $T_B$, is determined, e.g., by the ATE. If $T_D>0$ (or $T_B>T_C$), the ATE determines that the probe pin 130 corresponding to $T_D$ is in contact with the respective conductive pads to be tested of the wafer under test 170.

If all probe pins 130 corresponding to the conductive pads to be tested of the wafer under test 170 satisfy the relationship $T_D>0$, then the ATE determines that all conductive pads to be tested of the wafer under test 170 are in electrical contact with the respective probe pins 130. The continuity check is passed and further testing on the wafer under test 170 may begin.

However, if not all probe pins 130 corresponding to the conductive pads to be tested of the wafer under test 170 satisfy the relationship $T_D>0$, then it is determined that not all conductive pads to be tested of the wafer under test 170 are in electrical contact with the respective probe pins 130. The chuck 140 is driven toward the probe pins 130 with an increased overdrive amount, and the second set of measurements is repeated at least for those probe pins 130 that have not yet satisfied the relationship $T_D>0$. A new second propagation delay $T_B$ is obtained for each probe pin 130 subjected to the repeated second set of measurements, and a new $T_D$ value is calculated to determine whether the probe pin 130 now satisfies the relationship $T_D>0$ or not.

The described process of increasing the overdrive amount and repeating the second set of measurements is repeated until all probe pins 130 corresponding to the conductive pads to be tested of the wafer under test 170 satisfy the relationship $T_D>0$, or until the increased overdrive amount has exceeded a threshold. If the former, the continuity check is passed and further testing on the wafer under test 170 may begin. If the latter, the wafer under test 170 is rejected as failing the continuity check or the whole continuity check is rerun for the wafer under test 170 from the beginning (i.e., from the stage described with respect to FIG. 6A). If one or more reruns are still unsuccessful, the wafer under test 170 will be rejected as failing the continuity check.

The above described continuity check includes a first set of measurements performed with the probe pins 130 disconnected from the probe card circuit board 160 and a second set of measurements performed with the probe pins 130 connected to the probe card circuit board 160. Any probe card configurations in which the probe pins are electrically disconnectable from and connectable to the probe card circuit board are suitable for use in some embodiments.

Figure 7A:
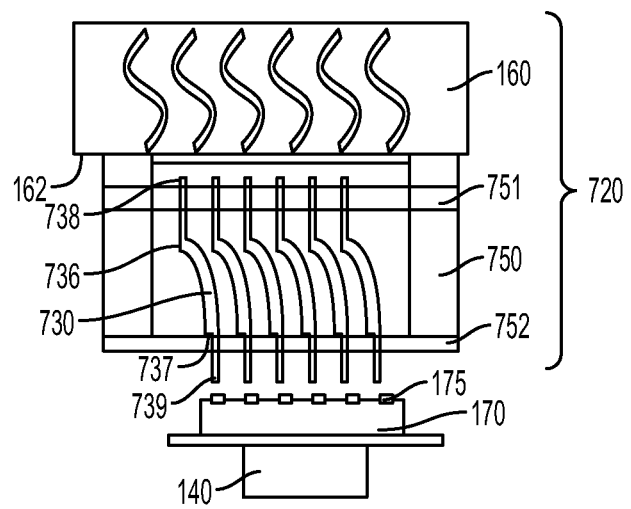
FIGS. 7A-7B are schematic diagrams of a probe card at various stages during a continuity check in accordance with some embodiments.
Figure 7B:
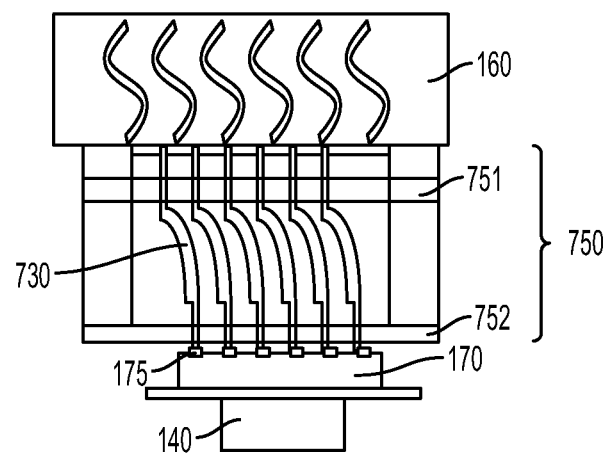

An exemplary probe card configuration will now be described with respect to FIGS. 7A-7B which are schematic diagrams of a probe card 720 at various stages during a continuity check in accordance with some embodiments.

The probe card 720 includes probe pins 730, a probe card circuit board 160, and a holder 750. In some embodiments, the probe pins 730 are similar to the probe pins 130. For example, pogo pins are used as the probe pins 730 in some embodiments. The probe pins 730 are also configured to cooperate with the holder 750 for displacement toward and away from the probe card circuit board 160.

The holder 750 is arranged for holding the probe pins 730 in alignment with the corresponding contact pads on the surface 162 of the probe card circuit board 160. In addition, the holder 750 is arranged to hold, while permitting displacement of, the probe pins 730, thereby enabling the probe pins 730 to move toward and away from the probe card circuit board 160, and to be electrically connected to and disconnected from the probe card circuit board 160. For example, holder 750 includes an upper holder 751 and a lower holder 752. The upper holder 751 has holes through each of which one end (e.g., 738 in FIG. 7A) of a respective probe pin 730 extends. The lower holder 752 has holes through each of which the opposite end (e.g., 739 in FIG. 7A) of a respective probe pin 730 extends. The holes in the upper holder 751 and lower holder 752 keep the respective probe pins 730 aligned with the corresponding contact pads on the surface 162 of the probe card circuit board 160, while permitting displacement of the probe pins 730 toward and away from the probe card circuit board 160.

One or more shoulders 736, 737 (best seen in FIG. 7A) are provided to each probe pin 730 to prevent the probe pin 730 from falling off the holder 750. However, any other probe pin retaining mechanism that also permits displacement of the probe pins 730 relative to the probe card circuit board 160 is usable in further embodiments.

A locking mechanism is also provided in some embodiments to lock the probe pins 730 at a fixed position relative to the probe card circuit board 160, e.g., at a contact position where the probe pins 730 are in electrical connection with the probe card circuit board 160 and/or a non-contact position where the probe pins 730 are not in electrical connection with the probe card circuit board 160.

In some embodiments, the probe pins 730 are brought from a non-contact position into the contact position simply by a movement of the chuck 140 and/or the wafer under test 170 supported on the chuck 140 relative to the probe pins 730. As shown in FIG. 7B, when the chuck 140 moves upward together with the wafer under test 170 supported thereon, the conductive pads 175 to be tested of the wafer under test 170, which are previously aligned with the ends 739 of the respective probe pins 730, are brought into contact with the respective probe pins 730 and also the ends 738 of the probe pins 730 are brought into contact with the respective contact pads on the surface 162 of the probe card circuit board 160.

In some embodiments, the probe pins 730 are locked at the contact position to ensure proper connection between the probe card circuit board 160 and the probe pins 730 during subsequent testing.

In further embodiments, the probe pins 730 are not locked (or locked and then released). As a result, when the chuck 140 is moved away from the probe pins 730 (e.g., for loading a new wafer under test), the probe pins 730 are also moved (e.g., under gravity) away from and electrically disconnected from the probe card circuit board 160. The probe card 720 returns to the state of FIG. 7A.

Figure 8:
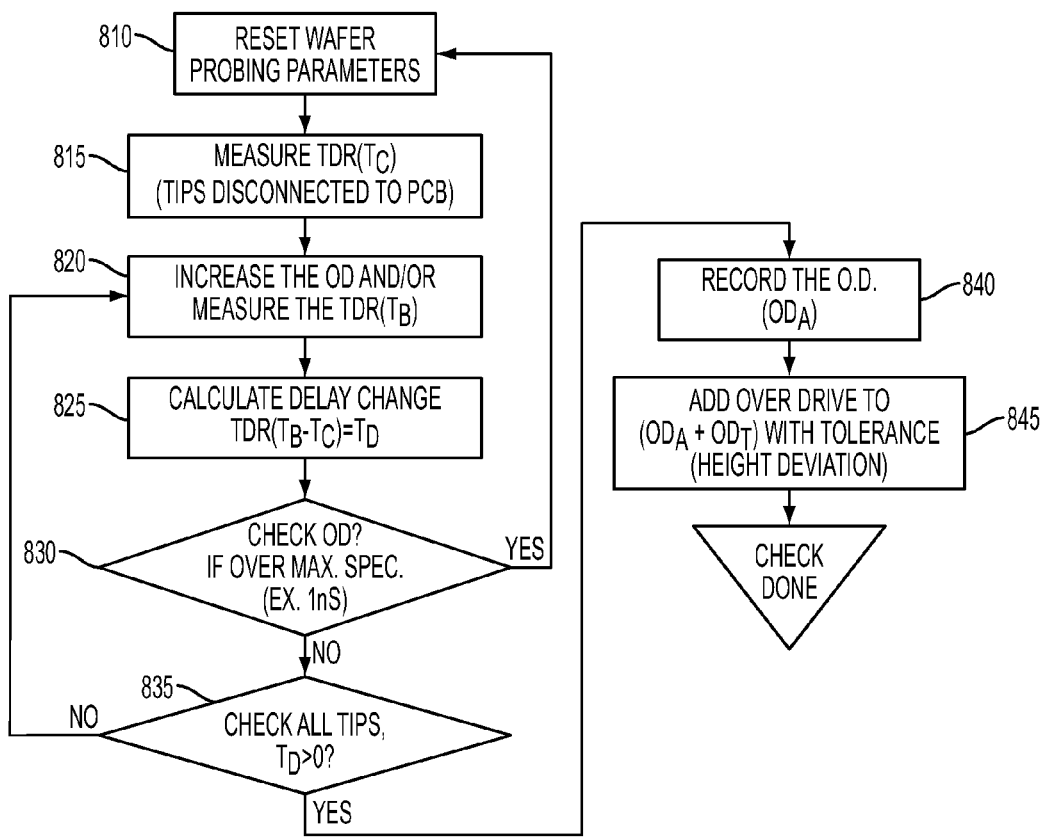
FIG. 8 is a flow chart of a continuity check process in accordance with some embodiments.

FIG. 8 is a flow chart of a continuity check process in accordance with some embodiments.

The continuity check process is to be performed in a wafer probing system (such as the system 100). The wafer probing system includes a test head (such as the test head 110), and a probe card (such as the probe card 720). The probe card has a plurality of probe pins (such as the probe pins 730), and a circuit board (such as the probe card circuit board 160) for supplying test signals from the test head to the probe pins. The wafer probing system further includes a support for supporting a wafer under test (such as the wafer under test 170) having conductive pads (such as the conductors 175) to be tested each corresponding to one of the probe pins. In some embodiments, the wafer support includes a chuck (such as the chuck 140), but other wafer supporting mechanisms are not excluded.

In the continuity check process, at step 810, a new wafer under test is loaded onto the chuck. All probing parameters are reset. The wafer under test loaded onto the chuck is now ready for a continuity check.

At step 815, a first set of measurements are performed with the probe pins disconnected from the probe card circuit board, as described with respect to FIG. 6A.

In some embodiments, the first set of measurements is not necessarily performed every time a new wafer under test is loaded, because the first set of measurements does not require a wafer. Thus, the first set of measurements is performed once and the results are stored and used for checking continuity for a predetermined number of wafers under test and/or for a predetermined period of time. After the predetermined number of wafers under test have been tested and/or after the predetermined period of time, the first set of measurements is performed to update the test results to remove operational variations.

At step 820, the probe pins are brought into contact with the probe card circuit board and the conductive pads to be tested of the loaded wafer under test, and a second set of measurements are performed with the probe pins connected to the probe card circuit board and the respective conductive pads to be tested of the wafer under test, as described with respect to FIG. 6B.

At step 825, differences between results of the first set of measurements and results of the second set of measurements are determined, as described with respect to FIGS. 6A-6B.

At step 830, it is verified whether the current overdrive amount exceeds a threshold. If yes, i.e., the current overdrive amount exceeds the threshold, the process proceeds to step 810 to reset probing parameters and rerun the continuity check. In some embodiments, a counter is kept for counting the number of reruns of the continuity check for a particular wafer under test. When a limit of acceptable reruns has been reached, the wafer is marked as failing the continuity check. If No, i.e., the current overdrive amount does not exceed the threshold, the process proceeds to step 835.

At step 835, it is verified whether the conductive pads to be tested of the wafer under test are all in contact with the respective probe pins, based on the differences determined at step 825, as described with respect to FIGS. 6A-6B. If No, i.e., not all conductive pads to be tested of the wafer under test are in contact with the respective probe pins, the process returns to step 820 where the current overdrive amount is incremented to press the probe pins closer toward the conductive pads to be tested of the wafer under test, and the second set of measurements is repeated. Differences between the results of the first set of measurements (step 815) and results of the repeated second set of measurements are determined at step 825, and then the incremented overdrive amount is compared with the threshold at step 830 as discussed above. If Yes, i.e., all conductive pads to be tested of the wafer under test are in contact with the respective probe pins, the process proceeds to step 840.

At step 840, the current overdrive amount $OD_A$ is recorded.

At step 845, an adjusted overdrive amount is obtained by adding a tolerance overdrive amount $OD_T$ to the recorded overdrive amount $OD_A$. The tolerance overdrive amount $OD_T$ covers height deviation among different wafers under test. The adjusted overdrive amount is used for testing the subsequent wafers under test, thereby improving testing speed.

In some embodiments, steps 830 and 835 switch place. In some embodiments, steps 810, 830, 840 and 845, or at least steps 840 and 845, are omitted. In some embodiments, the threshold for the overdrive amount (step 830) is about 100 µm.

After a wafer under test has passed, further testing processes begin. An exemplary testing process will be now described with respect to FIGS. 9A-9B which are diagrams for explaining TDR measurements in a wafer probing process in accordance with some embodiments.

Figure 9A:
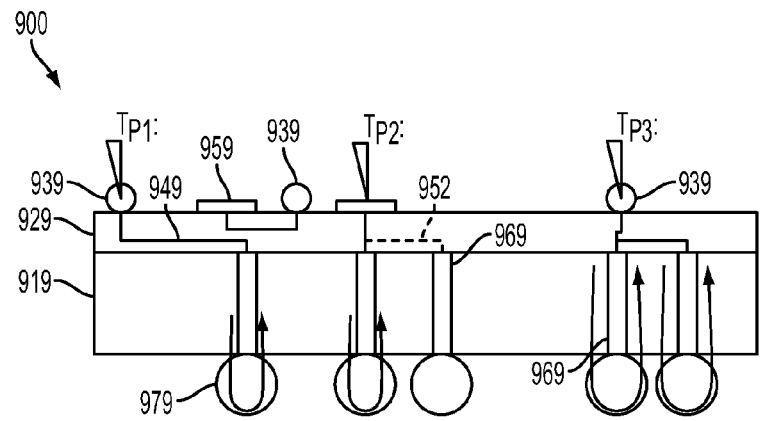
FIGS. 9A-9C are diagrams for explaining TDR measurements in a wafer probing process in accordance with some embodiments.

FIG. 9A is a diagram of an interposer 900 for use in forming a 3D IC. The interposer 900 in the embodiment specifically shown in FIG. 9A is a passive interposer. However, the principle described herein after is applicable to active interposers and/or other types of semiconductor wafers in accordance with further embodiments.

The interposer 900 includes a substrate 919, which is in some embodiments a Si substrate. The interposer 900 further includes a dielectric layer 929 on top of the substrate 919. A plurality of TSVs 969 are formed through the substrate 919. A lower end of each TSV 969 is electrically connected to a C4 (Controlled Collapse Chip Connection) bump 979 for subsequent electrical and/or mechanical connection to a package substrate. An upper end of each TSV 969 is electrically connected to a micro bump 939 or pad 959. The micro bumps 939 are subsequently used for electrical and/or mechanical connection to another chip or interposer in a 3D IC to be made. The pads 959 are used in some embodiments for testing. The TSVs 969 are connected to the micro bumps 939 and/or pads 959 via interconnects 949 in the dielectric layer 929. Plurality of interconnect structures are defined by the TSVs 969 and/or micro bumps 939 and/or interconnects 949 and/or pads 959 connected with each other.

For example, the interposer 900 includes interconnect structures TP1, TP2, TP3. The interconnect structure TP1 includes a micro bump 939 and a C4 bump 979 connected with each other via an interconnect 949 and a TSV 969. The interconnect structure TP2 includes a micro bump 939 and a C4 bump 979 connected with each other via a TSV 969. The interconnect structure TP3 includes a micro bump 939 connected with two C4 bumps 979 via two respective TSVs 969.

Figure 9B:
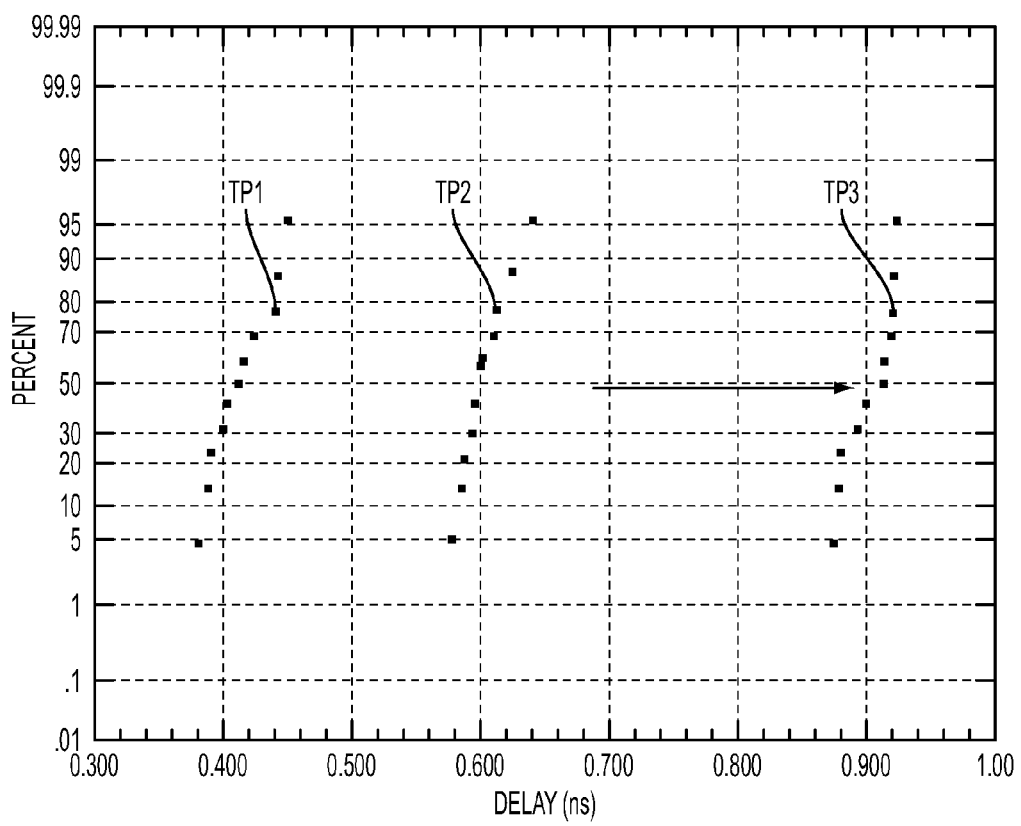

Different interconnect structures have different TDR values and/or different distributions of TDR values. For example, the different interconnect structures TP1, TP2, TP3 exhibit different distributions of TDR values when TDR measurements are performed on the interconnect structures TP1, TP2, TP3, as indicated in FIG. 9B. Thus, by performing a TDR measurement for each of the interconnect structure, and based on a result of the TDR measurement, the interconnect structure can be identified.

For example, when a probe pin (e.g., 130 in FIG. 1) is brought into reliable contact (e.g., via a continuity check as described with respect to FIGS. 6A-8) with the micro bump or pad of an interconnect structure, then a TDR measurement is performed and returns a TDR value distribution having a form similar to the TDR value distribution indicated as TP1 in FIG. 9B, the interconnect structure under test can be identified as having a structure similar to that of the interconnect structure TP1 in FIG. 9A. Likewise, if the returned TDR value distribution has a form similar to the TDR value distribution indicated as TP2 in FIG. 9B, the interconnect structure under test can be identified as having a structure similar to that of the interconnect structure TP2 in FIG. 9A.

Further, by comparing the identified interconnect structure with the expected interconnect structure, it is possible to determine whether a fault exists. For example, when probing the interconnect structure TP2 in FIG. 9A, it is expected to obtain a TDR value distribution having a form similar to the TDR value distribution indicated as TP2 in FIG. 9B. The expected TDR value distribution is predetermined by experimentation and/or simulation. However, if the TDR value distribution obtained from probing the interconnect structure TP2 does not have the form of the expected TDR value distribution, a fault exists. For example, if the TDR value distribution obtained from probing the interconnect structure TP2 has a form similar to the TDR value distribution indicated as TP3 in FIG. 9B, it is determined that a short circuit 952 (FIG. 9A) might have occurred to short a neighboring TSV 969 to the interconnect structure TP2 causing it to exhibit TDR characteristics like the interconnect structure TP3.

Thus, based on the result of TDR measurements, an interconnect structure under test is identified, and a fault is determined to exist when the result (e.g., TDR value distribution) of the TDR measurements for the identified interconnect structure does not match an expected result (e.g., TDR value distribution). In certain situation, the probable cause of the fault (e.g., a short circuit as 952 as described above) is determinable which helps debugging process defects and/or avoiding short circuit related problems such as burned chips, burned probe cards, etc.

Figure 9C:
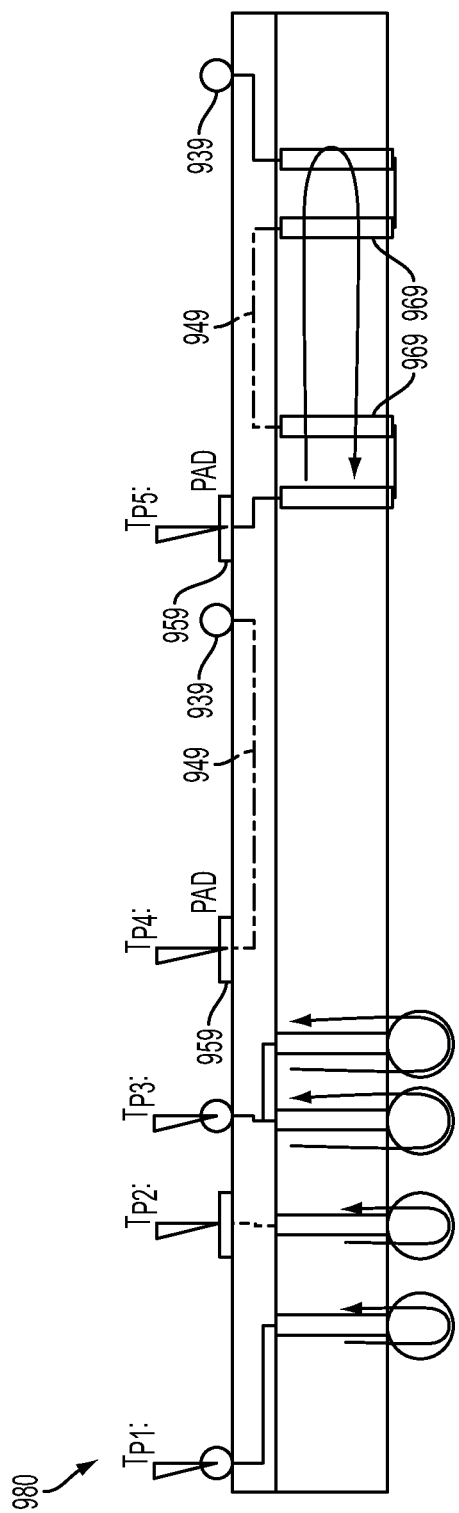

FIG. 9C is a diagram of an interposer 980 for use in forming a 3D IC. The interposer 980 includes a plurality of interconnect structures TP1-TP5 formed by connecting various TSVs 969 and/or micro bumps 939 and/or interconnects 949 and/or pads 959 in various ways.

As discussed above, pads 959 are provided in some embodiments for testing, because the micro bumps 939 might be crushed with the probe pins during test. In certain situations, the number of test pads is too large that the wafer probing system does not have enough signal channels to test (and/or it is not practical/required to test all test pads). In some embodiments using chains as exemplified by interconnect structures TP4, TP5 in FIG. 9C, it is possible to probe some (not all) test pads (or bumps) by a limited number of channels, while keeping the other test pads or bumps open. In such embodiments, by using TDR, the electrical path length or the connection status of each chain TP4, TP5 can be detected. If the connection is broken, the measured TDR time value would be shorter than an expected value. If the connection is shorted, the spectrum (TDR value distribution) would be longer or no returned (reflected) pulse would be received in the case of a short circuit that forms a loop-back trace. A no-return-pulse situation is determined in some embodiments by setting a maximum waiting time to receive a potential returned pulse and a no-return-pulse situation is flagged if no pulse is returned within the waiting time.

For example, for an interconnect structure like TP5 in FIG. 9C where eight TSV 969 are chained together, the expected TDR time value is about 0.3 ns. If the measured TDR time value is at 0.3 ns or higher, the interconnect structure TP5 is considered to pass the test. However, if the measured TDR time value is shorter than 0.3 ns, e.g., 0.1 ns, the interconnect structure TP5 is considered to fail the test.

Figure 10:
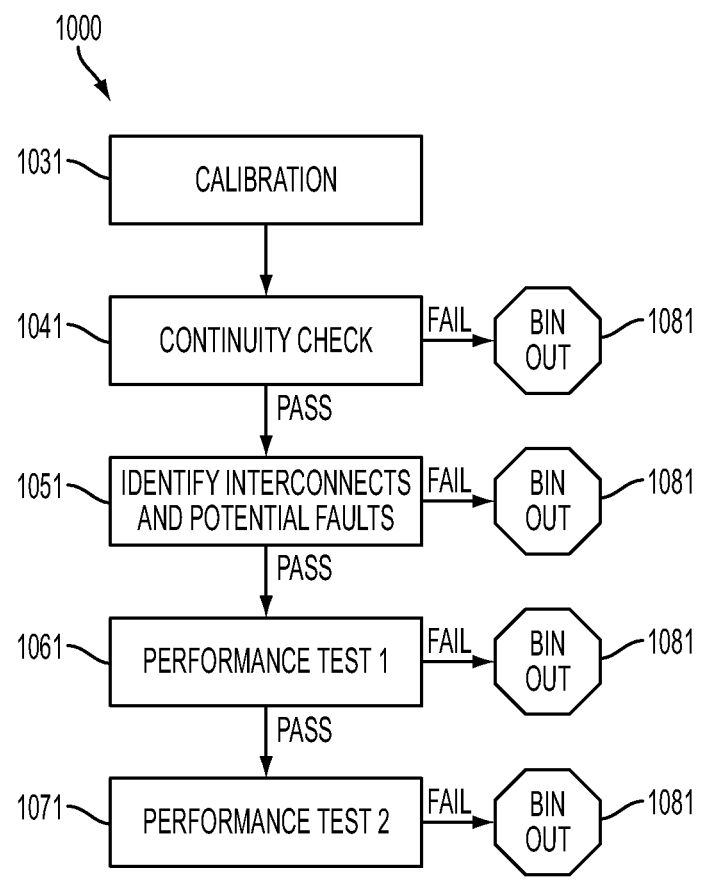
FIG. 10 is a flow chart of a wafer probing process in accordance with some embodiments.

FIG. 10 is a flow chart of a wafer probing process 1000 in accordance with some embodiments.

The wafer probing processes 1000 includes a calibrating step 1031 where the wafer probing system for performing the wafer probing processes 1000 is calibrated. In some embodiments, the calibrating step 1031 is performed as described with respect to FIGS. 3A-5.

At a continuity check step 1041, a continuity check between the conductive pads to be tested of the wafer under test and the respective probe pins of the wafer probing system is performed. If the continuity check is not passed, the wafer under test is rejected as indicated at 1081. In some embodiments, the continuity check step 1041 is performed as described with respect to FIGS. 6A-8.

At a step 1051, interconnect structures in the wafer under test are identified to determine potential faults. If faults exist, the wafer under test is rejected as indicated at 1081. In some embodiments, the step 1051 is performed as described with respect to FIGS. 9A-9C.

At steps 1061, 1071, further tests are performed in any manner contemplated by a person of ordinary skill in the art. If one or more of the further tests is not passed, the wafer under test is rejected as indicated at 1081.

In some embodiments, at least one of the steps 1031-1051 uses TDR.

In some embodiments, all of the steps 1031-1051 use TDR.

In some embodiments, one or more of the steps 1031-1071 is omitted.

The above method embodiment shows exemplary steps, but they are not necessarily required to be performed in the order shown. Steps may be added, replaced, changed order, and/or eliminated as appropriate, in accordance with the spirit and scope of embodiments of the disclosure. Embodiments that combine different features and/or different embodiments are within scope of the disclosure and will be apparent to those skilled in the art after reviewing this disclosure.

According to some embodiments, a wafer probing system includes a plurality of contacting pins connected to a test head. The system further includes a probe card electrically connectable with the test head, where the probe card includes a circuit board having a plurality of contact pads on opposite sides of the circuit board.

According to some embodiments, a wafer probing system includes a plurality of contacting pins connected to a test head. The system further includes a probe card electrically connectable with the test head, where the probe card includes a circuit board comprising a plurality of contact pads on opposite sides of the circuit board, where each contact pad of the plurality of contact pads on a first side of the opposite sides is electrically connected to a corresponding contact pad of the plurality of pads on a second side of the opposite sides. The probe card further includes a plurality of probe pins, where each probe pin of the plurality of probe pins is electrically connected to a corresponding contact pad of the plurality of pads on the second side of the opposite sides.

According to some embodiments, a wafer probing system includes: a test head, a probe card electrically connectable to and disconnectable from the test head, said probe card including a probe card circuit board and a plurality of probe pins. Additionally, the wafer probing system includes a chuck for supporting a wafer under test, said wafer having conductive pads, where each conductive pad of the conductive pads corresponding to one probe pin of the plurality of probe pins, said chuck being moveable toward and away from the probe pins. Furthermore, the wafer probing system includes a holder moveably holding the plurality of probe pins and enabling the plurality of probe pins to be moved toward and away from the probe card circuit board and to be connected to and disconnected from the probe card circuit board.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A wafer probing system comprising:
a plurality of contacting pins connected to a test head;
a probe card electrically connectable with the test head, wherein the plurality of contacting pins is between the test head and the probe card, and the probe card comprises:
a circuit board comprising a plurality of contact pads on opposite sides of the circuit board, and
a plurality of probe pins attached to a holder and reciprocatable relative to the circuit board, wherein the plurality of probe pins is configured to be separated from the probe card in a first measurement mode and is configured to be connected to the probe card in a second measurement mode.

2. The system of claim 1, wherein each contact pad of the plurality of contact pads on a first side of the opposite sides is electrically connected to a corresponding contact pad of the plurality of pads on a second side of the opposite sides.

3. The system of claim 2, wherein the plurality of probe pins extend downward from a side of the circuit board, wherein each probe pin of the plurality of probe pins is electrically connected to a corresponding contact pad of the plurality of pads on the second side of the opposite sides.

4. The system of claim 1, wherein the holder is configured to move at least one probe pin of the plurality of probe pins.

5. The system of claim 1, wherein
the test head is configured for measuring time-domain reflectometry (TDR) time values for at least one of:
calibrating the wafer probing system,
checking continuity between conductive pads of a wafer under test and respective probe pins, or
identifying if a fault exists with an interconnect structure in the wafer under test.

6. The system of claim 1, further comprising a chuck for supporting a wafer under test, wherein the chuck is configured to be moveable with respect to the probe card.

7. The system of claim 1, wherein the test head and the probe card are moveable relative to each other.

8. The system of claim 1, wherein the test head and the probe card are connected to each other via spring loaded pins.

9. A wafer probing system comprising:
a plurality of contacting pins connected to a test head;
a probe card electrically connectable with the test head, wherein the probe card comprises:
a circuit board comprising a plurality of contact pads on opposite sides of the circuit board, wherein each contact pad of the plurality of contact pads on a first side of the opposite sides is electrically connected to a corresponding contact pad of the plurality of pads on a second side of the opposite sides; and
a plurality of probe pins electrically disconnectable from the circuit board, wherein each probe pin of the plurality of probe pins is electrically connected to a corresponding contact pad of the plurality of pads on the second side of the opposite sides, each probe pin of the plurality of probe pins is configured to be separated from the probe card in a first measurement mode, and each probe pin of the plurality of probe pins is configured to be connected to the probe card in a second measurement mode.

10. The system of claim 9, further comprising a holder, wherein the holder is configured to move at least one probe pin of the plurality of probe pins.

11. The system of claim 9, wherein
the test head is configured for measuring time-domain reflectometry (TDR) time values for at least one of:
calibrating the wafer probing system,
checking continuity between conductive pads of a wafer under test and respective probe pins, or
identifying if a fault exists with an interconnect structure in the wafer under test.

12. The system of claim 9, further comprising a chuck for supporting a wafer under test, wherein the chuck is configured to be moveable toward and away from the probe card.

13. The system of claim 9, wherein the plurality of probe pins is pogo pins.

14. The system of claim 9, wherein the probe card is a tip-replaceable probe card.

15. A wafer probing system, comprising:
a test head,
a probe card electrically connectable to and disconnectable from the test head, said probe card including a probe card circuit board and a plurality of probe pins,
a chuck for supporting a wafer under test, said wafer having conductive pads, wherein each conductive pad of the conductive pads corresponding to one probe pin of the plurality of probe pins, said chuck being moveable toward and away from the probe pins; and
a holder moveably holding the plurality of probe pins and enabling the plurality of probe pins to be moved toward and to be connected to the probe card, and away from the probe card circuit board to form a gap between the plurality of probe pins and the probe card circuit board.

16. The system of claim 15, wherein
the test head is configured for measuring time-domain reflectometry (TDR) time values for at least one of:
calibrating the wafer probing system,
checking continuity between the conductive pads of the wafer under test and the respective probe pins, or
identifying if a fault exists with an interconnect structure in the wafer under test.

17. The system of claim 15, wherein the probe card circuit board comprises a plurality of contact pads on opposite sides of the probe card circuit board, wherein each contact pad of the plurality of contact pads on a first side of the opposite sides is electrically connected to a corresponding contact pad of the plurality of pads on a second side of the opposite sides.

18. The system of claim 15, wherein the test head and the probe card are moveable relative to each other.

19. The system of claim 15, wherein the plurality of probe pins are pogo pins.

20. The system of claim 15, wherein the probe card is a tip-replaceable probe card.

* * * * *